United States Patent [19]

Retzer et al.

[11] Patent Number: 5,554,988
[45] Date of Patent: Sep. 10, 1996

[54] APPARATUS AND METHOD FOR GENERATING A DATA SIGNAL

[75] Inventors: Michael H. Retzer, Palatine; Alan D. Muehlfeld, Mount Prospect, both of Ill.

[73] Assignee: Motorola, Inc., Schaumburg, Ill.

[21] Appl. No.: 295,967

[22] Filed: Aug. 23, 1994

[51] Int. Cl.⁶ .............. H03M 1/46; H03M 1/66; H03M 1/78
[52] U.S. Cl. .......... 341/154; 341/145; 341/127
[58] Field of Search .......... 341/144–154, 341/127

[56] References Cited

U.S. PATENT DOCUMENTS 5,134,398  7/1992  Yasutake .................. 341/119

Primary Examiner—Jeffrey A. Gaffin
Assistant Examiner—Peguy JeanPierre
Attorney, Agent, or Firm—Donna R. Maddox; Kevin A. Buford

[57] ABSTRACT

An apparatus is provided for generating a multiple-level amplitude modulated data signal. The circuit provides accurate data signal level control while minimizing transient errors. A controlling level, relative to an analog reference level is provided. Multiple bit reference levels are generated from the controlling level and analog reference level. A method is provided for selecting one of the reference levels.

10 Claims, 2 Drawing Sheets

APPARATUS AND METHOD FOR GENERATING A DATA SIGNAL

TECHNICAL FIELD

The present invention relates to signal modulation and more specifically to generating a multiple-level amplitude modulated data signal.

BACKGROUND OF THE INVENTION

As the newly created industry of mobile computing begins to mature, the need for wireless data communications has become increasingly apparent. Accurate, high-speed digital transmission is beginning to meet this need, but not without encountering difficult problems in the areas of accuracy, and in particular, transient errors.

In systems used to transmit digital information, the modulating signal can often be viewed as varying amplitude levels about a reference level (the DC part of the signal). The amplitude of the various levels in some manner encodes the desired information, and in such systems it is therefore necessary at the transmitter to be able to precisely control the amplitude of these levels.

Furthermore, in packet data systems designed to transmit digital information in bursts of a signal, possibly on a time-multiplexed shared channel, it is necessary to maintain these levels accurately throughout the duration of the signal burst. For any number of practical reasons, energy storage elements within the transmitting circuitry will cause transient errors to be imposed upon the desired signal levels, ultimately leading to errors in the received information. In such systems it is necessary to generate signals with controlled amplitude levels in a manner which minimizes this startup transient at the beginning of a packet burst.

To accomplish this, it is desired that the initial DC value of the signal generator, at the instant before the start of the signal burst, be equal to the average DC value of the signal during the data burst. This requires that the controlled amplitude levels of the signal be adjusted symmetrically about the DC reference, and that the generator is held near the DC reference level during the intervals when not actively generating a data burst.

Any circuitry used to accomplish the above two goals of accurate level generation and minimum startup transients must furthermore not corrupt the desired signal in any way; e.g. limit the frequency response or add any amplitude or time dependent distortions. It is also desirable that the adjustment of the accurate levels be accomplished easily during manufacture, or adaptively during actual field operation.

Towards these ends, practitioners have employed various circuits using manually adjustable potentiometers, electronic attenuators, digital to analog converters, etc., generally without totally satisfactory performance, particularly with the very high data rates and fast packet times of modern digital communications systems. Methods which set the signal levels by using attenuators within the signal path will affect the DC level of the signal, causing undesired startup transients. Also attenuation within the signal path can cause undesired frequency response roll-off or other distortions. Calculating the variable signal levels by performing mathematical operations within a digital signal processor, and generating the actual signal levels using a digital to analog converter, is prohibitively expensive, particularly for very high speed data waveforms.

Accordingly, a need exists for an apparatus that accurately controlling data signal levels while minimizing undesired transient effects.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

DETAILED DESCRIPTION OF A PREFERRED EMBODIMENT

Generally, the present invention provides a means for generating a data waveform using adjustable, symmetric signal levels about a central DC reference. The invention is capable of generating an idle level which is substantially the same as the central DC reference, for the purposes of minimizing any initial transient when the invention is employed in burst mode packet data systems.

Figure 1:
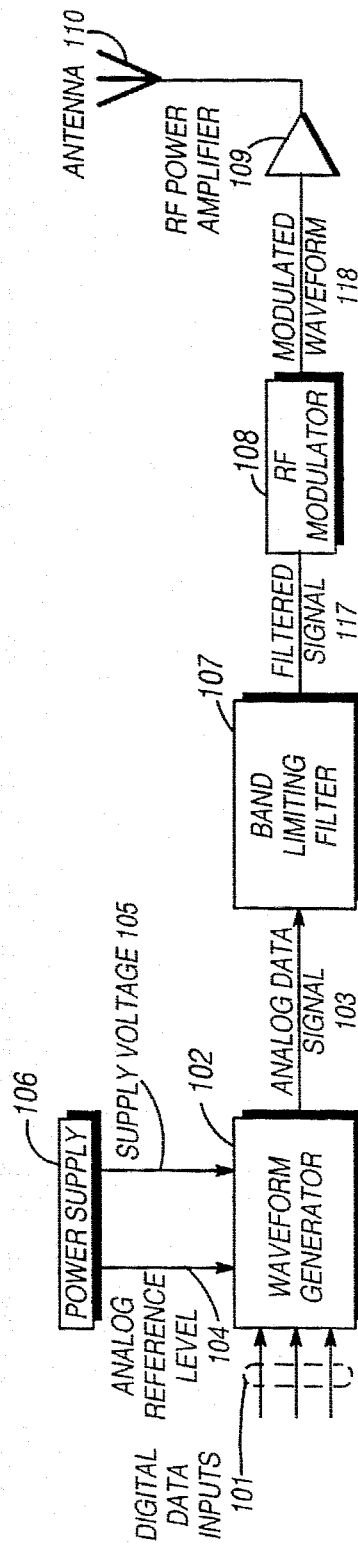
FIG. 1 is a architecture block diagram depicting a data packet radio using the waveform generator in accordance with a preferred embodiment of the present invention.

Referring to FIG. 1, a representative diagram of a radio transmitter for wireless data communications is depicted. The radio transmitter includes the digital data inputs (101), driving a waveform generator (102) for producing an analog data signal (103). The analog data signal (103) has amplitude and offset values relative to an analog reference level (104) and the supply voltage (105) provided by the system power supply (106). The analog data signal (103) is coupled to a band limiting filter (107), which provides a filtered signal (117) to a radio frequency modulator (108). The radio frequency modulator (108) generates the modulated waveform (118) for the radio frequency power amplifier (109), which is then transmitted by antenna (110).

Figure 2:
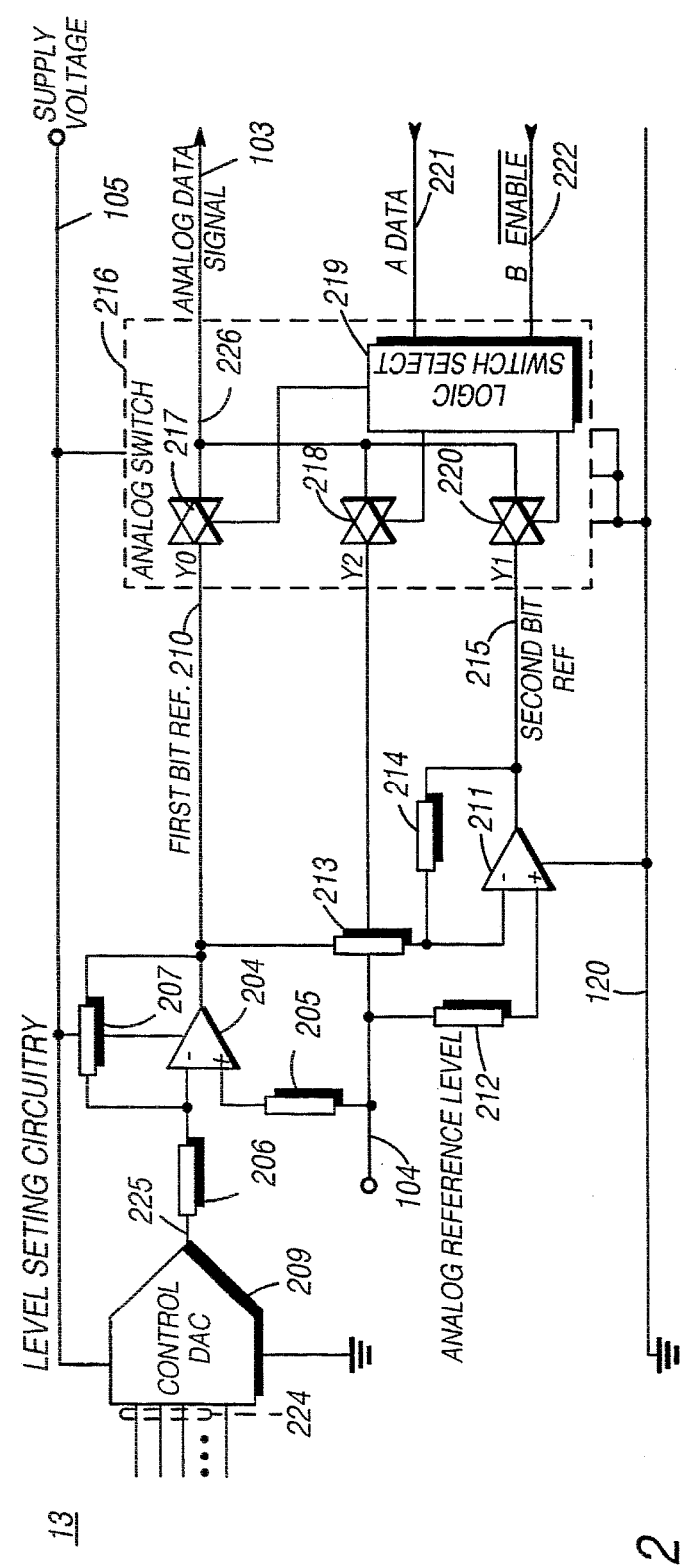
FIG. 2 is a circuit diagram of a waveform generator in accordance with a preferred embodiment of the present invention.

FIG. 2 illustrates a circuit diagram of the waveform generating circuit, in accordance with a preferred embodiment of the present invention. An analog reference level (104) is supplied to the circuit from the system power supply (106). The analog reference level (104) is at some level between the supply voltage (105) and actual circuit ground (120). The analog reference level (104) will be used as the midpoint reference level, about which the analog data signal (103) will be generated. The analog reference level (104) provides the bias into both inverting amplifiers (204, 211).

In a preferred embodiment of the present invention, the variable controlling level (225) for the analog data signal (103) amplitude is provided by the controlling means, digital-to-analog converter (DAC) (209). Alternatively, this can be controlled manually adjusted potentiometers, or other controlling apparatus. But it is convenient here to provide the variable control using digital means through the control lines (224). The digital controlling DAC (209), allows for other advantageous characteristics of the instant invention, including easy factory adjustment, or automatic adjustment in the field, of the amplitude parameters.

The variable controlling level (225) is buffered and inverted by amplifier (204), and associated resistors (206, 207). The output of amplifier (204) is the first bit reference level (210). For the preferred embodiment of the present invention, it is assumed that the value of the voltage at (210) is less than the value at the analog reference level (104), though this is not required. By proper adjustment of controlling voltage (225), any amplitude relative to the reference is obtainable at the first bit reference level (210).

The first bit reference level (210) is then inverted relative to the analog reference level (104), and buffered by inverting amplifier (211) and associated resistors (213, 214). In the preferred embodiment of the present invention, the values of resistors (213) and (214) are substantially the same, providing for a symmetric mirroring of the first bit reference level (210); i.e. the inverting amplifier's (211) input is biased at the analog reference level (104) through resistor (212). The difference in voltage between the first bit reference level (210) and the analog reference level (104) will cause a current to flow through resistor (213). A voltage difference is generated across the amplifier (211) inputs, causing amplifier (211) to adjust it's output so a current of equal magnitude but opposite sign is developed in resistor (214), thus driving the voltage difference at the amplifier (211) inputs to zero. Given that the resistors (213, 214) are substantially equal, with equal magnitude currents flowing through each, the voltage across resistor (214) will be equal in magnitude, but opposite in sign, to the voltage across resistor (213). Thus, the output of the inverting amplifier (211) provides the second bit reference level (215).

In alternative embodiments of the present invention, the bit reference levels (210, 215) can be established by a plurality of controlling digital-to-analog converters such as (209), to provide a plurality of bit reference levels.

It is important to note that the controlling DAC (209), inverting amplifiers (204, 211), and any of their associated circuitry, are providing in the instant invention only DC references, or at most, slowly changing adjustable references. As such, it is not required that any of the circuitry be particularly capable of high speed operation, even when operating in systems that generate very high speed data signal transitions.

In accordance with a preferred embodiment, the actual high speed data signal waveform is generated by appropriately routing the bit reference levels (210, 215) through a switching configuration (216), whose outputs are combined by a summing device (226) to form the analog data signal (103). The switching configuration (216) in a preferred embodiment of the present invention is comprised of a first analog switch (217), second analog switch (218), and third analog switch (220). In the preferred embodiment of the present invention, the switching configuration (216) and summing configuration or device (226) are implemented by a commercially available CMOS analog multiplexing switch (MC74HC4052). The switching configuration (216) can provide very fast switching times, allowing potentially very high data rates to be generated. The generation of the analog data signal (103) is accomplished by using digital data inputs (221, 222) to control switch selection logic (219). The logical truth table for the control is:

| 222 | 221 | |
|---|---|---|
| L | L | Select first bit reference 210 through switch 217. |
| L | H | Select second bit reference 215 through switch 220. |
| H | L | Disabled. Select analog reference 104 through switch 218. |
| H | H | Disabled. Select analog reference 104 through switch 218. |

In a preferred embodiment of the present invention, the digital data inputs (101) are comprised of an ENABLE input (222) and a DATA input (221). The ENABLE input (222) is used to enable data signaling or force the waveform output, analog data signal (103), to the analog reference level (104). The DATA input (221) supplies the data value to be modulated.

In operation, when the system is not generating packets of data for transmission, the ENABLE (222) input will be high, closing second analog switch (218), and opening first and third analog switches (217) and (220). The analog data signal (103) is forced to a value near the analog reference level (104). When generating packet data, the ENABLE (222) input will be set low, opening second analog switch (218). The data value on DATA input (221) will select first switch (218) or third switch (219), routing the appropriate bit reference level (210 or 215) to the analog data signal output (103). Since the bit reference levels (210, 215) were formed as symmetric mirror values about the analog reference level (104), the average analog data signal level (103) will always remain near the analog reference level (104). Since there is no average DC change at (103), there will be no initial transient errors at the start of a data packet.

Figure 3:
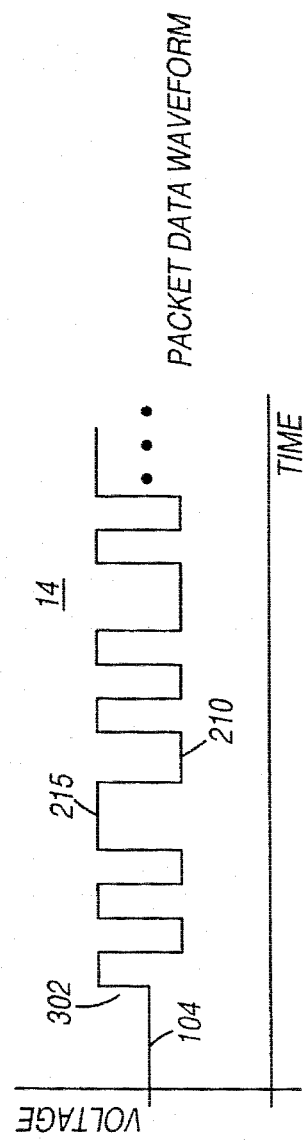
FIG. 3 shows a representative data waveform output of the waveform generator operating in accordance with a preferred embodiment of the present invention.

FIG. 3 shows a representative analog data signal (103). Prior to generating the packet data, this output, analog data signal (103), is forced to the analog reference level (104). At time (302), the waveform generator (102) is enabled and symmetric bit reference levels (210, 215) are present at the output, based on digital data inputs (221, 222).

Figure 4:
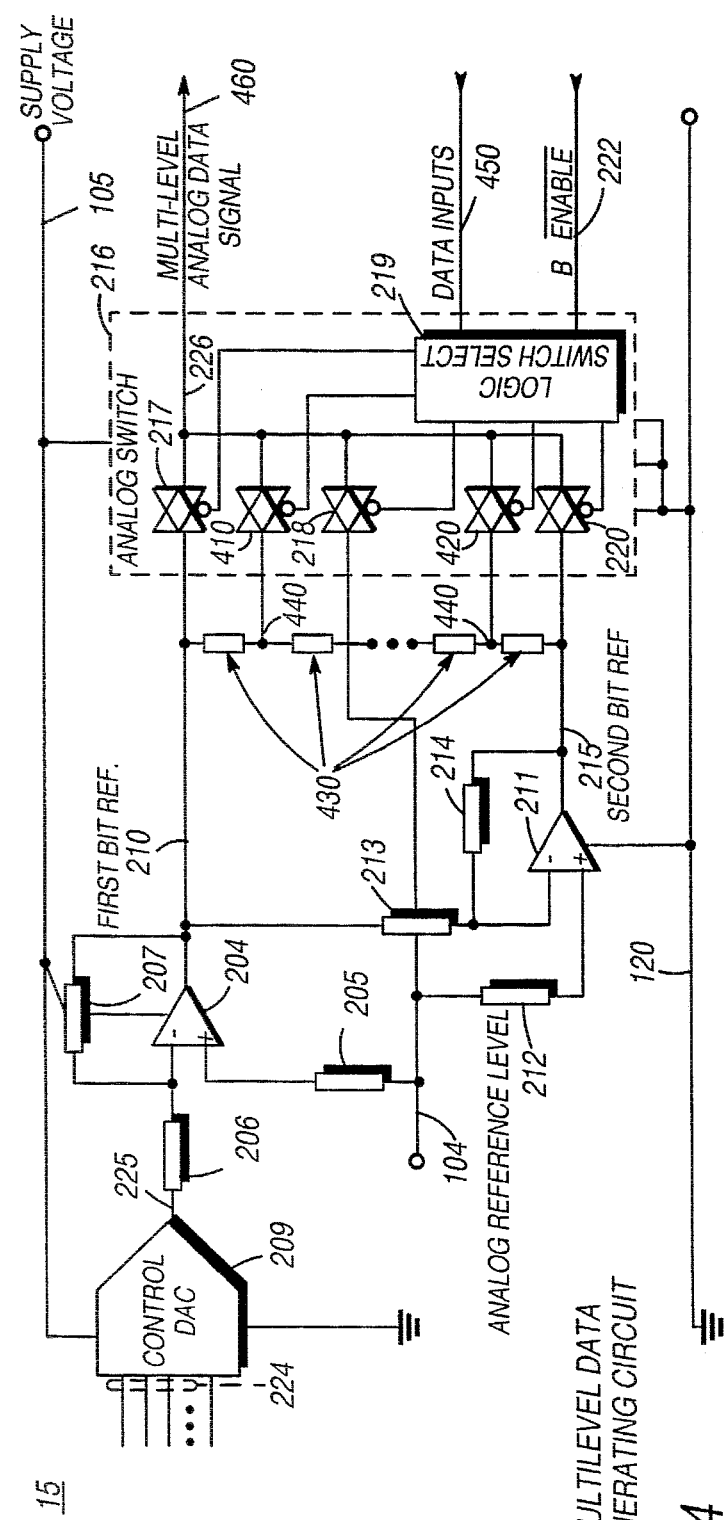
FIG. 4 is a circuit diagram of a waveform generator in accordance with an alternative embodiment of the instant invention.

The preferred embodiment of the present invention described above shows the generation of two level (binary) symbols, in addition to a third idle analog reference level (104). The present invention herein described can be easily extended to non-binary data systems, offering more than two active bit reference levels. These multiple bit reference levels can be generated by either duplicating multiple copies of the core circuitry (209, 204, 211) with different controlling levels (225), or by scaling multiple levels off of the existing circuitry. The switching configuration (216) then requires at least one separate switch for every unique level to be generated. Further appreciation of the instant invention and it's ready adaptability to different applications may be gained from the alternative embodiment shown in FIG. 4. This alternate embodiment of the present invention is particularly suitable for the generation of multiple-level analog data signals.

Circuitry for generating the first bit reference level (210) and second bit reference level (215) is identical to the preferred embodiment of the present invention, described above and shown in FIG. 2. An analog reference level (104) is supplied to the circuit from the system power supply. The analog reference level (104) is used as the midpoint reference level, about which a multi-level analog data signal (460) is generated. The analog reference level (104) provides the bias into inverting amplifiers (204, 211).

In this alternate embodiment of the present invention, the variable controlling level (225) for the signal amplitude is provided by the control digital-to-analog converter (209). The variable controlling level (225) is buffered and inverted by amplifier (204) and associated resistors (206, 207). The output of amplifier (204) is the first bit reference level (210).

The first bit reference level (210) is then inverted relative to the analog reference level (104) and buffered by inverting amplifier (211) and associated resistors (213, 214). The output of inverting amplifier (211) is the second bit reference level (215).

The first bit reference level (210) and second bit reference level (215) are subsequently scaled by a resistive network (430), providing multiple additional bit reference levels (440). Each additional bit reference level (440) is fed to a separate switch (410, 420) in the switching configuration (216).

A plurality of digital data inputs (460, 222) will control the switch selection logic (219), to select the appropriate switch, providing the appropriate bit reference level at the analog data signal output (103). In this manner, digital code words present on the digital data inputs (460, 222) are represented by well-controlled levels at the analog data signal output (103).

The above described embodiments of the instant invention have disclosed a highly inventive apparatus for generating a multiple-level, amplitude adjustable, data waveform. Further, the teachings of the instant invention have been shown to be particularly advantageous for eliminating initial transient error in packet data systems. Other advantages and applications within the true scope and spirit of the instant invention as defined by the appended claims below will become clear to practitioners of the art.

What is claimed is:

1. An apparatus for generating an analog data signal from digital data inputs, comprising:

an analog reference level;

a controlling level, relative to said analog reference level, providing a first bit reference level relative to said analog reference level;

an inverting amplifier, coupled to said first bit reference level, for providing a second bit reference level relative to said first bit reference level; and a switching configuration having an output, coupled to said digital data inputs and coupled to said reference levels for providing one of said reference levels at said output.

2. The apparatus recited in claim 1, wherein said controlling level is generated by a digital-to-analog converter.

3. The apparatus recited in claim 1, wherein said second bit reference level is equal in magnitude and opposite in sign of said first bit reference level relative to said analog reference level.

4. The apparatus as recited in claim 1, further comprising:

a resistive network coupled to said first bit reference level and said second bit reference level for providing additional bit reference levels, said additional bit reference levels being coupled to said switching configuration and being selectable by said digital data inputs.

5. An apparatus for generating an analog data signal from digital data inputs, comprising:

an analog reference level;

a first controlling level, relative to said analog reference level, providing a first bit reference level relative to said analog reference level;

a second controlling level, relative to said analog reference level, providing a second bit reference level relative to said first bit reference level; and a switching configuration having an output, coupled to said digital data inputs and coupled to said reference levels for providing one of said reference levels at said output.

6. The apparatus recited in claim 5, wherein said first controlling level and said second controlling level are generated by digital-to-analog converters.

7. The apparatus recited in claim 5, wherein said second bit reference level is equal in magnitude and opposite in sign of said first bit reference level relative to said analog reference level.

8. The apparatus as recited in claim 5, further comprising:

a resistive network coupled to said first bit reference level and said second bit reference level for providing additional bit reference levels, said additional bit reference levels being coupled to said switching configuration and being selectable by said digital data inputs.

9. A method for generating an analog data signal from digital data inputs, comprising the steps of:

providing an analog reference level;

providing a controlling level, relative to said analog reference level;

generating a first bit reference level relative to said analog reference level, said first bit reference level having a magnitude determined by said controlling level;

generating a second bit reference level being equal in magnitude and opposite in sign of said first bit reference level relative to said analog reference level; and selecting one of said reference levels, based on said digital data inputs.

10. An apparatus for generating an analog data signal from digital data inputs, comprising:

an analog reference level;

a controlling level, relative to said analog reference level, providing a first bit reference level relative to said analog reference level;

an inverting amplifier, coupled to said first bit reference level, for providing a second bit reference level relative to said first bit reference level;

a first analog switch coupled to said first bit reference level;

a second analog switch coupled to said analog reference level;

a third analog switch coupled to said second bit reference level;

a switch selection logic coupled to said digital data inputs for selecting one of said analog switches; and a summing configuration connecting the outputs of said analog switches, for providing said analog data signal.

* * * * *